(12) United States Patent
Johnson et al.

(10) Patent No.: US 6,853,184 B2
(45) Date of Patent: Feb. 8, 2005

(54) METHODS AND SYSTEMS FOR UTILIZING A RING MAGNET FOR MAGNETIC SENSING APPLICATIONS

(75) Inventors: Curtis B. Johnson, Freeport, IL (US); Thomas J. Olson, Freeport, IL (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/307,759

(22) Filed: Dec. 2, 2002

(65) Prior Publication Data

US 2004/0104719 A1 Jun. 3, 2004

(51) Int. Cl.[7] ............................................. G01B 7/30
(52) U.S. Cl. .......................... 324/207.21; 324/207.25; 324/207.22
(58) Field of Search ..................... 324/207.22, 207.2, 324/207.21, 207.24, 207.25, 207.26; 338/32 R, 32 H

(56) References Cited

U.S. PATENT DOCUMENTS

| | | | |
|---|---|---|---|
| 4,801,830 A | * 1/1989 | Ogino et al. | 310/68 B |
| 4,924,064 A | 5/1990 | Stormbom et al. | 219/121.69 |
| 5,209,202 A | 5/1993 | Maurer et al. | 123/406.11 |
| 5,296,819 A | 3/1994 | Kuroiwa et al. | 324/670 |
| 5,568,048 A | * 10/1996 | Schroeder et al. | 324/207.21 |
| 5,633,546 A | * 5/1997 | Horst | 310/68 B |
| 5,698,777 A | 12/1997 | Ramseyer et al. | 73/116 |
| 5,789,915 A | 8/1998 | Ingraham | 324/207.2 |
| 6,073,713 A | 6/2000 | Brandenburg et al. | 180/65.2 |
| 6,198,372 B1 | 3/2001 | Schwarz | 335/302 |
| 6,297,628 B1 | 10/2001 | Bicking et al. | 324/207.21 |
| 6,302,085 B1 | 10/2001 | Sekine et al. | 123/406.62 |
| 6,404,185 B1 | 6/2002 | Allwine | 324/207.2 |
| 6,452,383 B1 | 9/2002 | Goedecke | 324/207.22 |
| 2002/0054824 A1 | 5/2002 | Tokoro et al. | 419/30 |

FOREIGN PATENT DOCUMENTS

| | | | |
|---|---|---|---|
| FR | 2687834 | | 8/1993 |
| JP | 03075566 | * | 3/1991 |

OTHER PUBLICATIONS

Suzuki, et al., "Durable giant magnetoresistive sensors using Co/Cu superlattices," Thin Solid Films 304 (1997), pp. 333–338.

WO 00/29815; PCT/US99/24878, May 25, 2000, p. 3, line 26 –p. 4, line 16, Figures 3–4.

PCT Notification of the International Sear Report or the Declaration, Date of Mailing Jun. 11, 2004, International Application No. PCT/US 03/38035.

* cited by examiner

Primary Examiner—Jay Patidar
(74) Attorney, Agent, or Firm—Kris T. Fredrick; Kermit D. Lopez; Luis M. Ortiz

(57) ABSTRACT

Methods and systems of utilizing a ring magnet for magnetic sensing applications thereof are disclosed. A magnetoresistive sensor device can be provided which is associated with a ring magnet configured as a sensing target. The magnetoresistive sensor device is insensitive to magnetic pole polarities. The ring magnet is generally magnetized to include a plurality of magnetic poles, such that at least one pole thereof is larger than at least one other pole thereof. An output signal can then be produced from the magnetoresistive sensor device via a digital circuit thereof. The output signal is independent of a rotation of the sensing target. The sensor itself is rotationally insensitive provided that the ring magnet is symmetrically magnetized.

20 Claims, 3 Drawing Sheets

METHODS AND SYSTEMS FOR UTILIZING A RING MAGNET FOR MAGNETIC SENSING APPLICATIONS

TECHNICAL FIELD

The present invention relates generally to the field of magnetically sensitive sensors. The present invention is also generally related to sensing methods and systems. The present invention is additionally related to sensors utilized in automotive and mechanical applications. The present invention is also related to anisotropic magnetoresistive (AMR) sensor devices. The present invention is also related to ring magnets utilized in magnetic sensing applications.

BACKGROUND OF THE INVENTION

Various sensors are known in the magnetic-effect sensing arts. Examples of common magnetic-effect sensors include, for example, magnetoresistive and Hall effect technologies. Such magnetic sensors can generally respond to a change in the magnetic field as influenced by the presence or absence of a ferromagnetic target object of a designed shape passing by the sensory field of the magnetic-effect sensor. The sensor can then provide an electrical output, which can be further modified as necessary by subsequent electronics to yield sensing and control information. The subsequent electronics may be located either onboard or outboard of the sensor package.

Many automotive electronic systems utilize position sensors for a number of related applications. Such position sensors typically incorporate magnetic sensors, including for example, ring magnets. Ring magnets are well known in the magnetic sensing arts and when employed in the context of automotive sensors, typically span transmission, crankshaft, and camshaft applications. When position sensors for automotive electronic systems were originally conceived and developed, such sensors were primarily utilized for the determination of clutch pedal and shift lever positions in automobile transmission applications. Reasonably accurate linear position sensing is required to identify the positions of the clutch pedal and the shift lever, using electrical signals from a non-contacting sensor approach.

In automated manual transmission applications, for example, two sensors may be required to sense the shift lever position as it moves in an H-pattern from Reverse to Low to Second to Third gear. For a standard automatic transmission application, where the shift lever moves along a single axis direction, one position sensor may be required to sense whether the shift lever is in one of the Drive-Mode operating positions (i.e., Forward, Reverse, Neutral, Over-Drive, Low, etc.) as well as any positions between such operating conditions.

Many of the sensors utilized in automotive applications employ a 60-2 digital tooth pulse train from their crankshaft sensor. A typical 60-2 digital tooth pulse train is generated from 60 equally spaced teeth with 2 teeth thereof removed for a reference. This type of configuration can be obtained by providing either a 58 tooth metal target, or a 58 pole pair ring magnet incorporated thereof. The automotive industry is currently focusing on 60-2 pulse patterns for its crankshaft application. This is, of course, subject to change depending upon the shifting needs of the industry.

One of the problems that such conventional configurations produces is a resulting output that is dependent upon target rotation, thereby requiring a larger number of poles at the associated ring magnet. Conventional configurations require a large number of poles to produce a particular pulse pattern because they generally produce one pulse per pole pair, which in essence means that such devices are sensitive to magnet polarities. Because a larger number of poles are required, the magnet pole widths are very narrow. These narrow pole widths prevent greater magnetic influence at the magnetic sensor, resulting in sometimes faulty or inefficient readings, which in turn can cause failure in automotive applications.

The present inventors have thus concluded that a need exists for improved magnetic sensor methods and systems, which utilize ring magnets. In particular, the present inventors believe that these problems can be overcome through the application of the invention described herein.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present invention to provide improved sensor methods and systems.

It is another aspect of the present invention to provide for a sensor that can be used in automotive and mechanical applications.

It is yet another aspect of the present invention to provide a magnetoresistive sensor, which utilizes a ring magnet to achieve a sensor pulse train.

The aforementioned aspects of the invention and other objectives and advantages can be achieved as is now described herein. Methods and systems of utilizing a ring magnet as a target for magnetic sensing applications thereof are described herein. A magnetoresistive sensor device can be provided, which is associated with a ring magnet that can function as a sensing target. The magnetoresistive sensor device is generally insensitive to magnetic pole polarities. The ring magnet can be magnetized to include a plurality of magnetic poles (e.g., 58 poles, which is equivalent to 30-1 pole pairs), such that at least one pole thereof is larger than at least one other pole thereof. An output signal can then be produced from the magnetoresistive sensor device via a digital circuit thereof, wherein the output signal is independent of a rotation of the sensing target.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate at least one embodiment of the present invention and are not intended to limit the scope of the invention.

Figure 1:
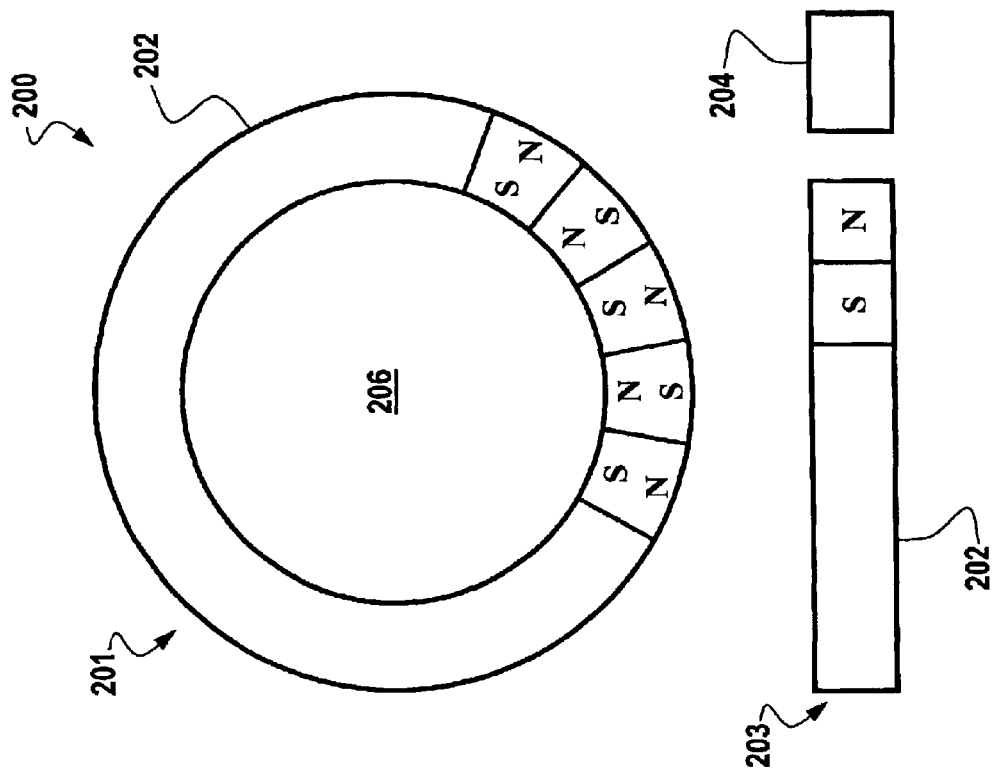
FIG. 1 illustrates a diagram of a ring magnet, which can be utilized in accordance with a preferred embodiment of the present invention.

FIG. 1 illustrates a diagram of a ring magnet 100, which can be utilized in accordance with a preferred embodiment of the present invention. In FIG. 1, both a top view 101 and a side view 103 of ring magnet 100 are depicted. Ring magnet 100 can be configured to include a central portion 106 in the form of an air gap, which is surrounded by a magnet body 102 in the shape of a ring or other circular figure. Ring magnet 100 depicted in FIG. 1 can be configured as an axially magnetized ring magnet. A sensor 104, which is located proximate to ring magnet 102, senses the ring magnet axially. Sensor 104 can be configured in the form of an anisotropic magnetoresistive (AMR) sensing device.

Ring magnet 100 may be configured as a symmetrically magnetized ring magnet, as evidenced by the N-S-N-S, etc. configuration of ring magnet 100. Ring magnet 100 may be magnetized not only axially, but also symmetrically, depending upon design considerations. In FIG. 1, a plurality of magnetic poles (N-S-N-S, etc.) is illustrated, which are generally configured such that one or more poles are larger than the other. For example, an N pole may be larger than an S pole. Similarly, an S (i.e., south) pole may be larger than an N (i.e., north) pole, depending upon particular design considerations. As indicated herein, however, ring magnet 100 or other similar ring magnets can be sensed, wherein such ring magnets possess a single large pole (e.g., 18 degrees north or south). while the other poles may posses an equally smaller size (e.g., 6 degrees). The ring magnet 100 is thus generally symmetrical about the middle of this large pole given that the poles must exist in pairs. The larger pole pair, however, does not require an equally sized pole.

Figure 2:
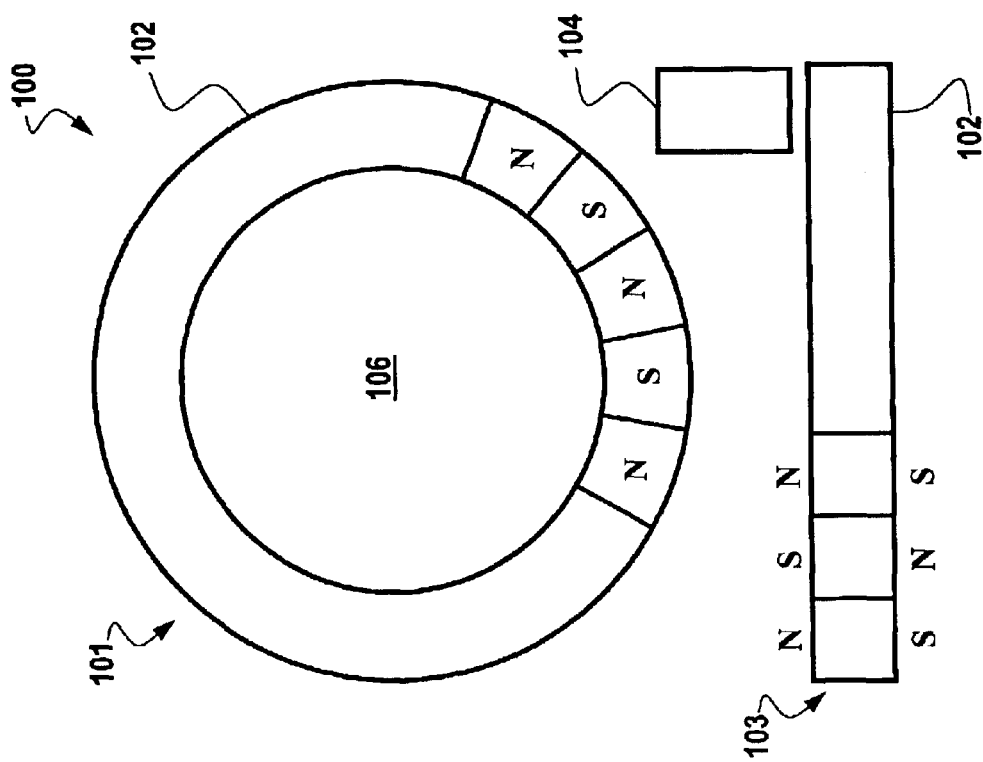
FIG. 2 depicts a diagram of a ring magnet, which can be utilized in accordance with an alternative embodiment of the present invention.

FIG. 2 depicts a diagram of a ring magnet 200, which may be utilized in accordance with an alternative embodiment of the present invention. FIG. 2, both a top view 201 and a side view 203 of ring magnet 200 are depicted. Ring magnet 200 includes a central portion 206 in the form of an air gap, which is surrounded by a magnet body 202 in the shape of a ring or other circular figure. Ring magnet 200 depicted in FIG. 2 can be configured as a radially magnetized ring magnet. A sensor 204, which is located proximate to ring magnet 202 radially senses ring magnet 200. It can be appreciated by those skilled in the art that sensor 204 is generally analogous to sensor 104 of FIG. 1, and may be implemented as an AMR sensor that incorporates a magnetoresistive bridge circuit (not shown).

Figure 3:
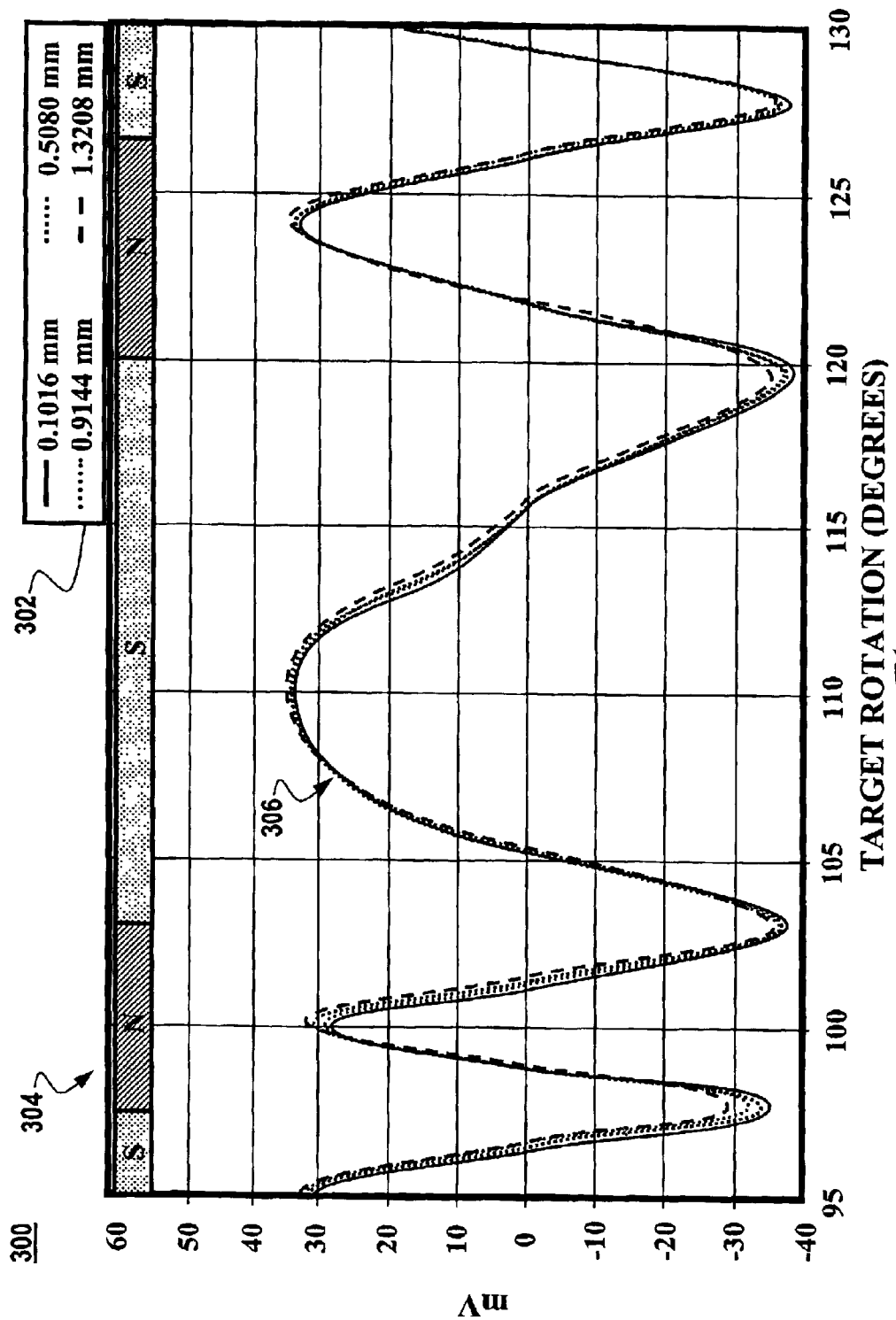
FIG. 3 illustrates a graph illustrating the relationship between an MR analog signal and a plurality of magnetic poles, in accordance with a preferred embodiment of the present invention.

FIG. 3 depicts a graph 300 illustrating the relationship between an MR analog signal and a plurality of magnetic poles 304, in accordance with a preferred embodiment of the present invention. According to graph 300, one period of an analog signal can occur per a single pole, and does not differentiate between the different pole polarities. Thus, the output is pole polarity insensitive or the sensor can produce two pulses per pole pair. A legend box 302 is associated with graph 300 to indicate particular data mapped by AMR analog signal 306. The x-axis of graph 300 provides data in the form of target rotation (i.e., degrees), while the y-axis of graph 300 is measured in mV. Graph 300 thus describes an analog MR signal versus digital output associated with a 58-pole sensor and a 60-2 digital output.

Figure 4:
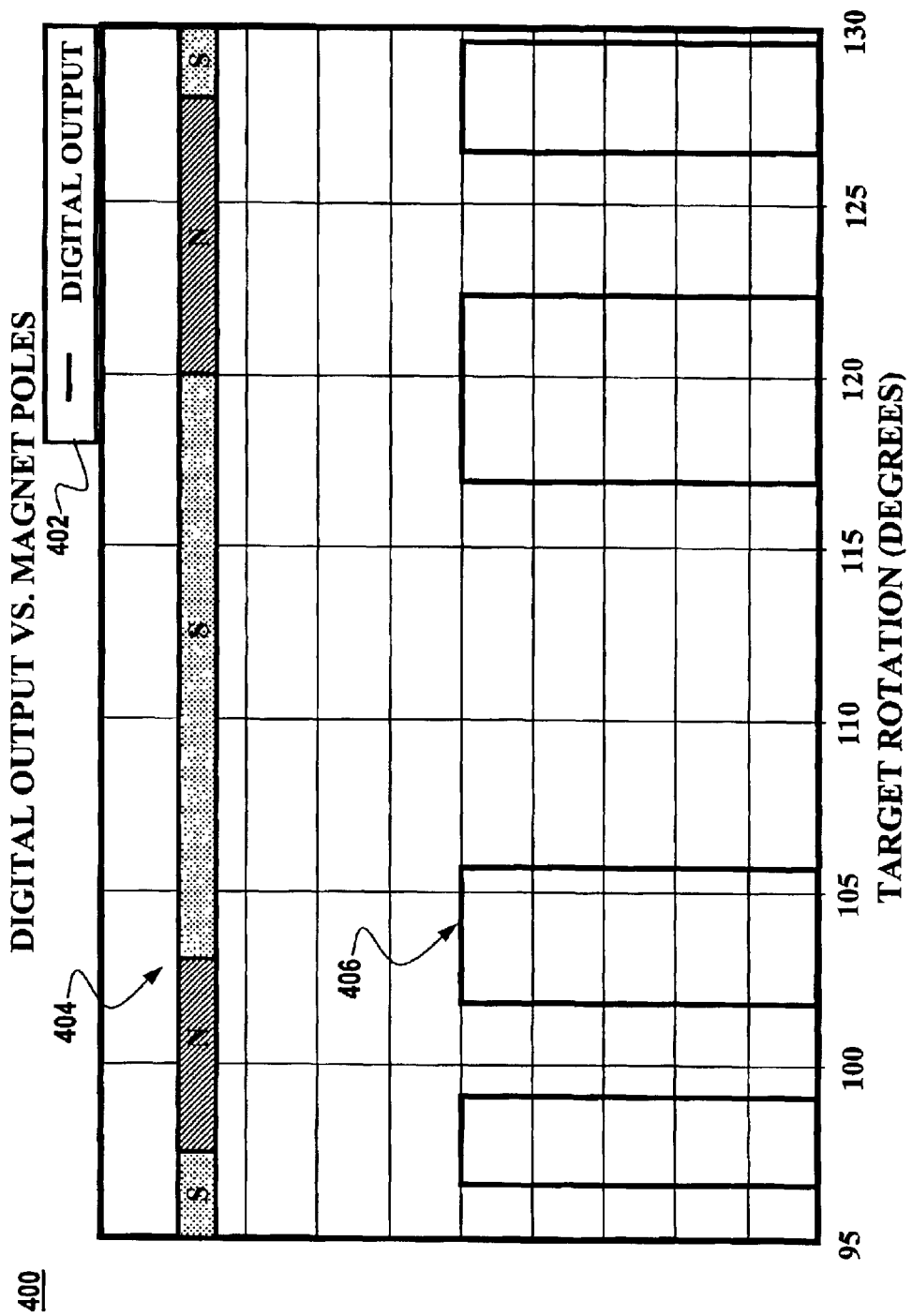
FIG. 4 depicts a graph depicting the relationship between an MR digital signal and a plurality of magnetic poles, in accordance with a preferred embodiment of the present invention.

FIG. 4 illustrates a graph 400 depicting the relationship between an MR digital signal and a plurality of magnetic poles 404, in accordance with a preferred embodiment of the present invention. Graph 400 illustrates digital output versus magnet poles. As indicated in FIG. 4, the digital output of a sensor associated with graph 400 produces a digital signal between 0V and a desired open collector output, which may vary depending upon a desired implementation. Typically, this value can be in a range of approximately 5V or 12V, but is not limited to any particular voltage level. Graph 400 demonstrates how the magnet poles 404 can match a digital output signal 406. Note that the digital output signal 406 is also indicated by legend box 402. As indicated in graph 400, the sensor switches between the middle of the pole and the pole-to-pole transition. On the other hand, it can be seen from graph 300 of FIG. 3 that the maximum analog signal swing is obtained at the center of the magnet pole at the magnet pole transitions.

The present invention offers a number of advantages, including the advantage that a full sensor output period can be generated with a single magnet pole. This in turn creates what can be referred to as a two pulses per magnet pole pair. A majority of conventional sensors produce 1 pulse per pole pair (i.e., sensitive to the magnet polarity). Conventional automotive crank speed sensor targets are beginning to focus on 60-2 targets, or 58 equal teeth/slot pairs with a large signature feature. This signature feature is equal to the removal of 2 teeth, thus the name 60-2 target. By creating the 60-2 output pattern as described herein with a ring magnet and a magnetic sensor, a 58-pole magnet of which one pole is larger can be produced, thereby creating the signature features described above.

Other sensors require twice the number of poles (e.g., 1 pulse per pole pair sensors) to obtain the same 60-2 output pattern. The solution described herein, on the other hand, reduces the number of magnet poles required (i.e., inexpensive manufacturing) of which the pole pitches are therefore larger. This allows for greater sensor performance and easier manufacturing of the ring magnet.

It should be appreciated by those skilled in the art, with respect to varying embodiments of the present invention that the 60-2 pulse pattern solution described herein represents merely one of many possible embodiments of the present invention. The calling out of a 58-pole ring magnet is unique to one possible embodiment of the present invention, which utilizes an AMR sensor applied in a particular manner. Fewer or more than 58-poles may be implemented in accordance with particular embodiments of the present invention. It can thus be appreciated by those skilled in the art that a ring magnet solution, as described herein, can produce a 60-2 pulse pattern that possesses either 116 poles (i.e., 120-4) or 58 poles (i.e., 60-2), depending upon how the associated ARM sensor is implemented. The embodiments described herein are therefore not limited to "-2" feature, but may be adapted to other values. The "-2" feature described herein is presented solely for illustrative purposes only and is thus not considered a limiting feature of the present invention.

One particular advantage represented by an embodiment of the present invention, is that it is insensitive to magnet pole polarities, or can also produce 2 pulses per pole (i.e., which is analogous to insensitivity to magnet pole polarities). With this in mind, to produce a 60-2 configuration in accordance with an embodiment of the present invention can require half as many poles, therefore increasing the pole width of a given ring magnet diameter. A configuration of this type can permit greater magnet influence from the ring magnet or can allow the ring magnet to be manufactured with a much more inexpensive (i.e., lower) grade magnetic material, while producing the same sensor performance. As indicated earlier, conventional configurations require a large number of poles to produce a particular pulse pattern because they generally produce one pulse per pole pair, which in essence means that such devices are sensitive to magnet polarities. The embodiments depicted herein, however, require half the number of poles compared to such conventional technologies.

Another advantage of the sensor configuration described herein, with respect to particular embodiments of the present invention, is that this type of sensor is rotationally insensitive, which means that the output will be the same no matter which direction the target is rotated, provided that the ring magnet is symmetrically magnetized. Additionally, due to the nature of the sensor design, the sensor described herein can function according to TPO (True Power On) principals. When power is applied, the sensor provides the correct output given its location on the ring magnet prior to the rotation of the ring magnet.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

What is claimed is:

1. A method of utilizing a ring magnet for magnetic sensing applications thereof, said method comprising the step of:
   providing a symmetrically magnetized ring magnet located proximate to a magnetoresistive sensor device that is insensitive to magnetic pole polarities, wherein said symmetrically magnetized ring magnet comprises a sensing target thereof magnetized to comprise a plurality of magnetic poles, such that at least one pole thereof is larger than at least one other pole thereof, wherein said symmetrically magnetized ring magnet comprises a magnet body surrounding a central portion thereof from an air gap is formed; and
   producing an output signal from said magnetoresistive sensor device, wherein said output signal is independent of a rotation of said sensing target and wherein one period of an analog signal represented by said output signal can occur per a single pole and does not differentiate between different pole polarities.

2. The method of claim 1 wherein said output signal is insensitive to magnetic pole polarities because said one period of said analog signal represented by said output signal can occur per said single pole and does not differentiate between different pole polarities.

3. The method of claim 1 wherein said plurality of magnetic poles comprises at least fifty-eight magnetic poles.

4. The method of claim 1 further comprising the step of:
   configuring said magnetoresistive sensor device to comprise at least one anisotropic magnetoresistive bridge circuit.

5. The method of claim 1 further comprising the step of:
   configuring said magnetoresistive sensor device as a two-pulse per pole anisotropic magnetoresistive sensor device.

6. The method of claim 1 wherein the step of producing an output signal from said magnetoresistive sensor device, wherein said output signal is independent of a rotation of said sensing target, further comprises the step of:
   producing said output signal from said magnetoresistive sensor device, wherein said output signal comprises a crankshaft sensor pulse train that is independent of said rotation of said sensing target.

7. The method of claim 1 wherein said plurality of magnetic poles comprises at least twenty-nine magnetic pole pairs of which at least one pole thereof is larger than at least one pole thereof to produce a 60-2 output pattern in a form of a 60-2 digital tooth pulse train.

8. The method of claim 1 wherein said magnetoresistive sensor device comprises a TPO (True Power On) sensor.

9. The method of claim 1 further comprising the step of:
   generating a complete sensor output period from a single magnetic pole associated with said magnetoresistive sensor device.

10. A method of utilizing a ring magnet for magnetic sensing applications thereof, said method comprising the step of:
    providing a symmetrically magnetized ring magnet comprising a sensing target, wherein said symmetrically magnetized ring magnet is located proximate to a magnetoresistive sensor device that is insensitive to magnetic pole polarities, wherein said symmetrically magnetized ring magnet comprises a magnet body surrounding a central portion thereof from an air gap is formed;
    configuring said magnetoresistive sensor device to comprise at least one anisotropic magnetoresistive bridge circuit, such that said magnetoresistive sensor device comprises a two-pulse per pole anisotropic magnetoresistive sensor device;
    magnetizing said symmetrically magnetized ring magnet to comprise at least fifty-eight magnetic poles, wherein at least one pole thereof is larger than at least one other pole thereof; and
    producing an output signal from said magnetoresistive sensor device, wherein said output signal is independent of a rotation of said sensing target because one period of an analog signal represented by said output signal can occur per a single pole and does not differentiate between different pole polarities thereof.

11. A system for utilizing a ring magnet in magnetic sensing applications thereof, said system comprising:
    a magnetoresistive sensor device that is insensitive to magnetic pole polarities;
    a symmetrically magnetized ring magnet located comprising a sensing target, wherein said symmetrically magnetized ring magnet is associated with said magnetoresistive sensor device and is magnetized to comprise a plurality of magnetic poles, wherein at least one pole thereof is larger than at least one other pole thereof, wherein said symmetrically magnetized ring magnet comprises a magnet body surrounding a central portion thereof from an air gap is formed; and a digital circuit for producing an output signal from said magnetoresistive sensor device, wherein said output signal is independent of a rotation of said sensing target and wherein said digital circuit is associated with said magnetoresistive sensor device and wherein one period of an analog signal represented by said output signal can occur per a single pole and does not differentiate between different pole polarities.

12. The system of claim 11 wherein said output signal is insensitive to magnetic pole polarities.

13. The system of claim 11 wherein said plurality of magnetic poles comprises at least fifty-eight magnetic poles.

14. The system of claim 11 wherein said magnetoresistive sensor device comprises at least one anisotropic magnetoresistive bridge circuit.

15. The system of claim 11 wherein said magnetoresistive sensor device comprises a two-pulse per pole anisotropic magnetoresistive sensor device.

16. The system of claim 11 wherein said output signal comprises a crankshaft sensor pulse train that is independent of said rotation of said sensing target.

17. The system of claim 11 wherein said symmetrically magnetized ring magnet is magnetized to comprise at least twenty-nine magnetic pole pairs of which at least one pole thereof Is larger than at least one pole thereof to produce a 60-2 output pattern in the form of a 60-2 digital tooth pulse train.

18. The system of claim 11 wherein said magnetoresistive sensor device comprises a TPO (True Power On) sensor.

19. The system of claim 11 wherein a complete sensor output period is generated from a single magnetic pole associated with said magnetoresistive sensor device.

20. A system for utilizing a ring magnet in magnetic sensing applications thereof, said system comprising:

a magnetoresistive sensor device associated with a symmetrically magnetized ring magnet, wherein said magnetoresistive sensor device is insensitive to magnetic pole polarities and comprises at least one anisotropic magnetoresistive bridge circuit thereby forming a two-pulse per pole anisotropic magnetoresistive sensor device thereof;

a symmetrically magnetized ring magnet associated with said magnetoresistive sensor device, wherein said symmetrically magnetized ring magnet is symmetrically magnetized and comprises a sensing target and is magnetized to include a plurality of magnetic poles, wherein at least one pole thereof is larger than at least one other pole thereof, wherein said symmetrically magnetized ring magnet comprises a magnet body surrounding a central portion thereof from an air gap is formed; and wherein an output signal is generated from said magnetoresistive sensor device, wherein said output signal is independent of a rotation of said sensing target and wherein said magnetoresistive sensor device is rotationally insensitive due to said symmetrically magnetized ring magnet.

* * * * *